(12) United States Patent
Yaworski

(10) Patent No.: US 9,425,605 B2
(45) Date of Patent: Aug. 23, 2016

(54) METHOD FOR PROTECTING A CABLE SPLICE CONNECTION WITH A COVER ASSEMBLY

(71) Applicant: Tyco Electronics Corporation, Berwyn, PA (US)

(72) Inventor: Harry George Yaworski, Apex, NC (US)

(73) Assignee: Tyco Electronics Corporation, Berwyn, PA (US)

(*) Notice: Subject to any disclaimer, the term of this patent is extended or adjusted under 35 U.S.C. 154(b) by 506 days.

(21) Appl. No.: 13/827,291

(22) Filed: Mar. 14, 2013

(65) Prior Publication Data

US 2014/0262500 A1    Sep. 18, 2014

(51) Int. Cl.
| | |
|---|---|
| *H01R 43/00* | (2006.01) |
| *H02G 15/08* | (2006.01) |
| *H02G 1/14* | (2006.01) |
| *H02G 15/18* | (2006.01) |
| *H02G 15/013* | (2006.01) |
| *H02G 15/184* | (2006.01) |

(52) U.S. Cl.
CPC ............. *H02G 15/08* (2013.01); *H02G 1/14* (2013.01); *H02G 15/1833* (2013.01); *H02G 15/013* (2013.01); *H02G 15/184* (2013.01); *Y10T 29/49194* (2015.01)

(58) Field of Classification Search
CPC ....... H02G 15/08; H02G 15/068; H02G 1/14; H02G 15/1833; H02G 15/013; H02G 15/184; Y10T 29/49194; Y10T 29/49195; Y10T 29/49174; H01R 4/72

USPC .......... 29/857, 868, 869; 174/74, 88 R, 93 A
See application file for complete search history.

(56) References Cited

U.S. PATENT DOCUMENTS

| | | |
|---|---|---|
| 1,526,397 A | 2/1925 | Albin |
| 4,383,131 A | 5/1983 | Clabburn |
| 5,735,981 A | 4/1998 | Winfield et al. |

(Continued)

FOREIGN PATENT DOCUMENTS

| | | |
|---|---|---|
| EP | 0780949 A1 | 6/1997 |
| WO | WO 97/32381 A1 | 9/1997 |

(Continued)

OTHER PUBLICATIONS

International Search Report Corresponding to International Application No. PCT/US2014/022608; Date of Mailing: Jul. 18, 2014 (11 pages).

*Primary Examiner* — Donghai D Nguyen
(74) *Attorney, Agent, or Firm* — Myers Bigel & Sibley, P.A.

(57) ABSTRACT

A method for protecting a cable splice connection including a cable, the cable including an electrical conductor surrounded by a cable insulation layer, includes providing a splice body assembly including: an electrically insulative, elastomeric splice body having an interior surface defining an interior passage; and a layer of a conformable medium pre-mounted on the interior surface of the splice body. The conformable medium is a flowable, electrically insulative material. The method further includes mounting the splice body assembly on the cable splice connection such that the layer of the conformable mastic is interposed between and engages each of the interior surface of the splice body and an opposing interface surface of the cable insulation layer.

16 Claims, 6 Drawing Sheets

(56) References Cited

U.S. PATENT DOCUMENTS

| | | |
|---|---|---|
| 5,753,861 A | 5/1998 | Hansen et al. |
| 5,844,170 A * | 12/1998 | Chor .................. H02G 15/068 174/93 |
| 6,245,999 B1 | 6/2001 | Costigan et al. |
| 6,762,364 B2 | 7/2004 | Hofmann et al. |
| 7,304,242 B1 | 12/2007 | Dower et al. |
| 7,858,883 B2 * | 12/2010 | Seraj .................. H01R 4/72 174/88 R |
| 7,863,521 B2 | 1/2011 | Campbell et al. |
| 7,901,243 B1 | 3/2011 | Yaworski |

FOREIGN PATENT DOCUMENTS

| | | |
|---|---|---|
| WO | WO 00/01048 A1 | 1/2000 |
| WO | WO 2013/153501 A1 | 10/2013 |

* cited by examiner

METHOD FOR PROTECTING A CABLE SPLICE CONNECTION WITH A COVER ASSEMBLY

FIELD OF THE INVENTION

The present invention relates to electrical cables and connections and, more particularly, to protective covers for electrical cables and electrical connections.

BACKGROUND OF THE INVENTION

In the electrical utilities industry, maintaining cable integrity may be critical. A loss of cable integrity, for example, a short circuit in a high voltage cable, may result in a crippling power outage or, even worse, a loss of life. One everyday task that may pose a great threat to cable integrity is the formation of electrical connections.

When electrical connections are formed, a bare metal surface may be exposed such as a splice connector. These bare metal surfaces may be particularly hazardous when formed in the field where they are exposed to the environment. This environment may include rocks and other sharp objects as well as moisture when the connection is to be buried under ground and rainfall when the connection is to be suspended in the air. Thus, there is a need to protect such electrical connections from the environment.

SUMMARY OF THE INVENTION

According to embodiments of the present invention, a method for protecting a cable splice connection including a cable, the cable including an electrical conductor surrounded by a cable insulation layer, includes providing a splice body assembly including: an electrically insulative, elastomeric splice body having an interior surface defining an interior passage; and a layer of a conformable medium pre-mounted on the interior surface of the splice body. The conformable medium is a flowable, electrically insulative material. The method further includes mounting the splice body assembly on the cable splice connection such that the layer of the conformable mastic is interposed between and engages each of the interior surface of the splice body and an opposing interface surface of the cable insulation layer.

According to embodiments of the present invention, a pre-expanded cover assembly for protecting a cable splice connection including a cable, the cable including an electrical conductor surrounded by a cable insulation layer, includes a splice body assembly and a removable holdout. The splice body assembly includes an electrically insulative, elastomeric splice body and a layer of a conformable medium. The conformable medium is a flowable, electrically insulative material. The splice body has an interior surface defining an interior passage. The layer of the conformable medium is pre-mounted on the interior surface of the splice body. The splice body assembly is mounted on the holdout such that the holdout maintains the splice body in an elastically radially expanded state, and the holdout is selectively removable from the splice body to permit the splice body to elastically radially contract. The layer of the conformable medium is positioned and configured such that, when the pre-expanded cover assembly is positioned adjacent the cable splice connection, the holdout is removed from the splice body, and the splice body elastically radially contracts onto the cable splice connection, the layer of the conformable medium will be interposed between and engage each of the interior surface of the splice body and an opposing interface surface of the cable insulation.

According to method embodiments of the present invention, a method for protecting a cable splice connection including a cable, the cable including an electrical conductor surrounded by a cable insulation layer, includes: providing an electrically insulative, elastomeric splice body having an interior surface defining an interior passage; providing a silicone rubber-based mastic; and mounting the splice body and a layer of the mastic on the cable splice connection such that the layer of mastic is interposed between and engages each of the interior surface of the splice body and an opposing interface surface of the cable insulation layer.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

Figure 1:
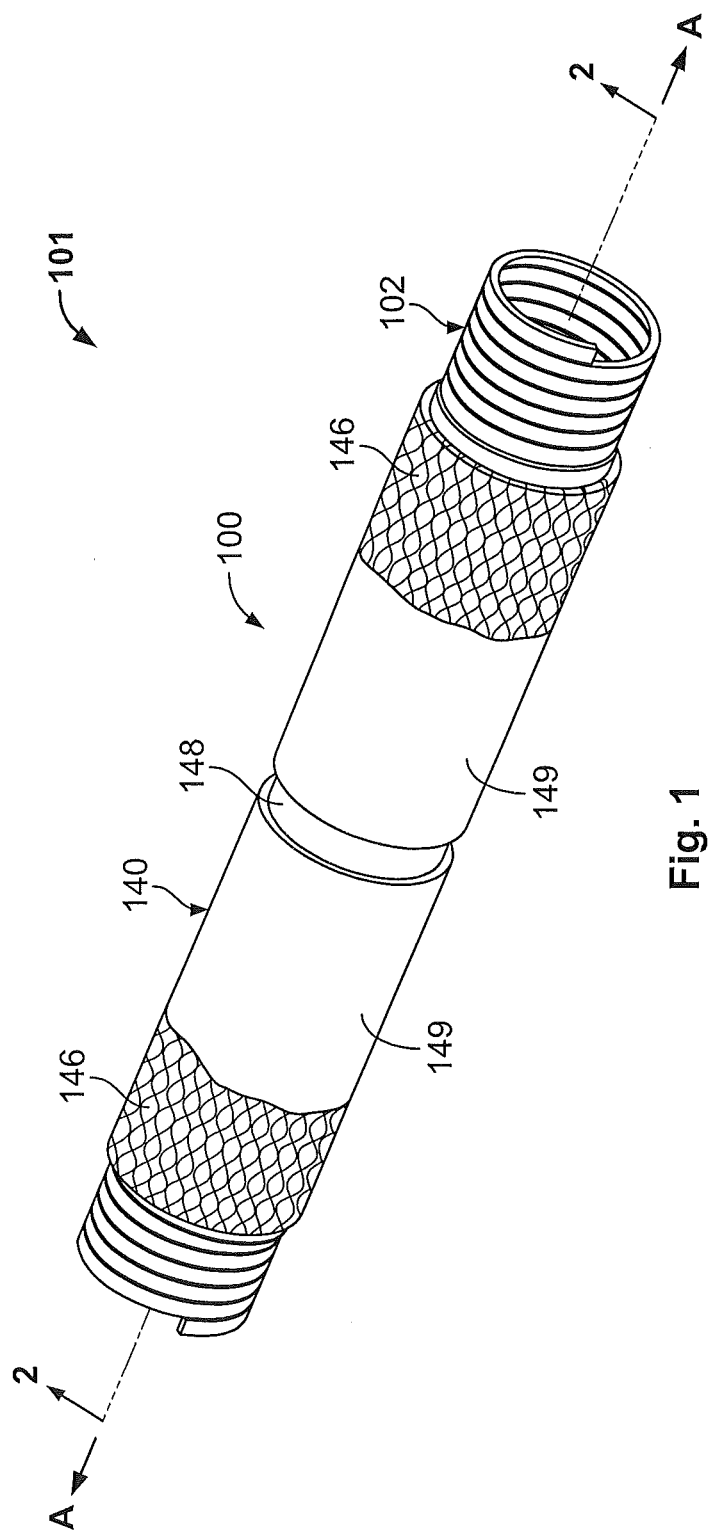
FIG. 1 is a perspective view of a pre-expanded cover assembly unit according to embodiments of the present invention.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, "cold-applied" or "cold-applied cover" means that the cover or component can be assembled or installed about a substrate (e.g., a cable) without requiring the use of applied heat at the time of installation.

As used herein, "cold shrink" or "cold shrink cover" means that the cover or component can be shrunk or contracted about a substrate (e.g., a cable) without requiring the use of applied heat.

Figure 2:
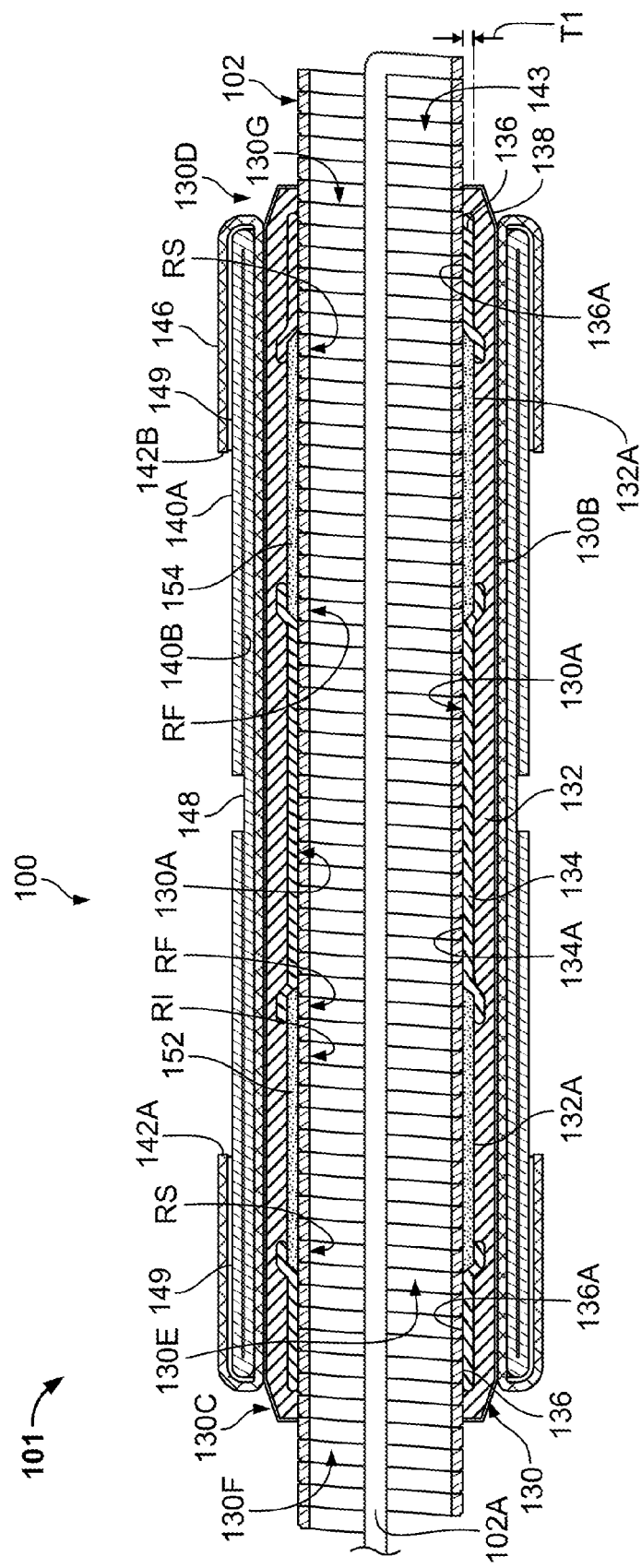
FIG. 2 is a cross-sectional view of the pre-expanded cover assembly unit of FIG. 1 taken along the line 2-2 of FIG. 1.
Figure 3:
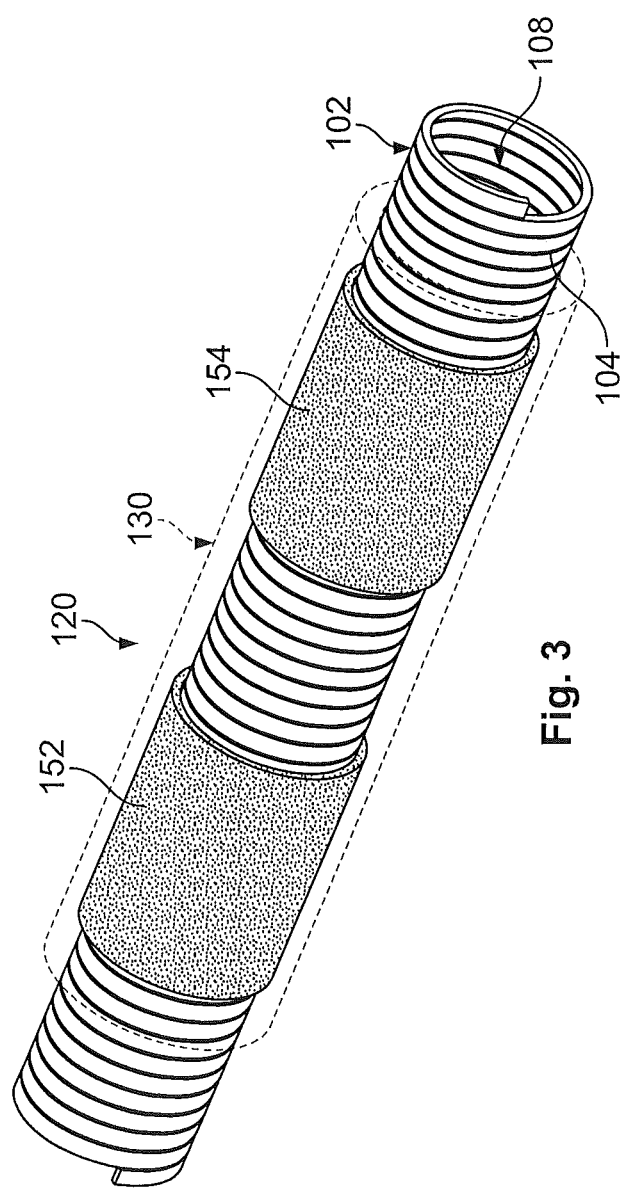
FIG. 3 is a perspective view of a splice body assembly according to embodiments of the present invention and forming a part of the pre-expanded cover assembly of FIG. 1.

With reference to FIGS. 1-6, a cover assembly 100 according to some embodiments of the present invention is shown therein. The cover assembly 100 may be provided as a pre-expanded cover assembly unit 101 including a holdout device 102, as shown in FIGS. 1 and 2, wherein the cover assembly 100 is in an expanded state or position.

Figure 5:
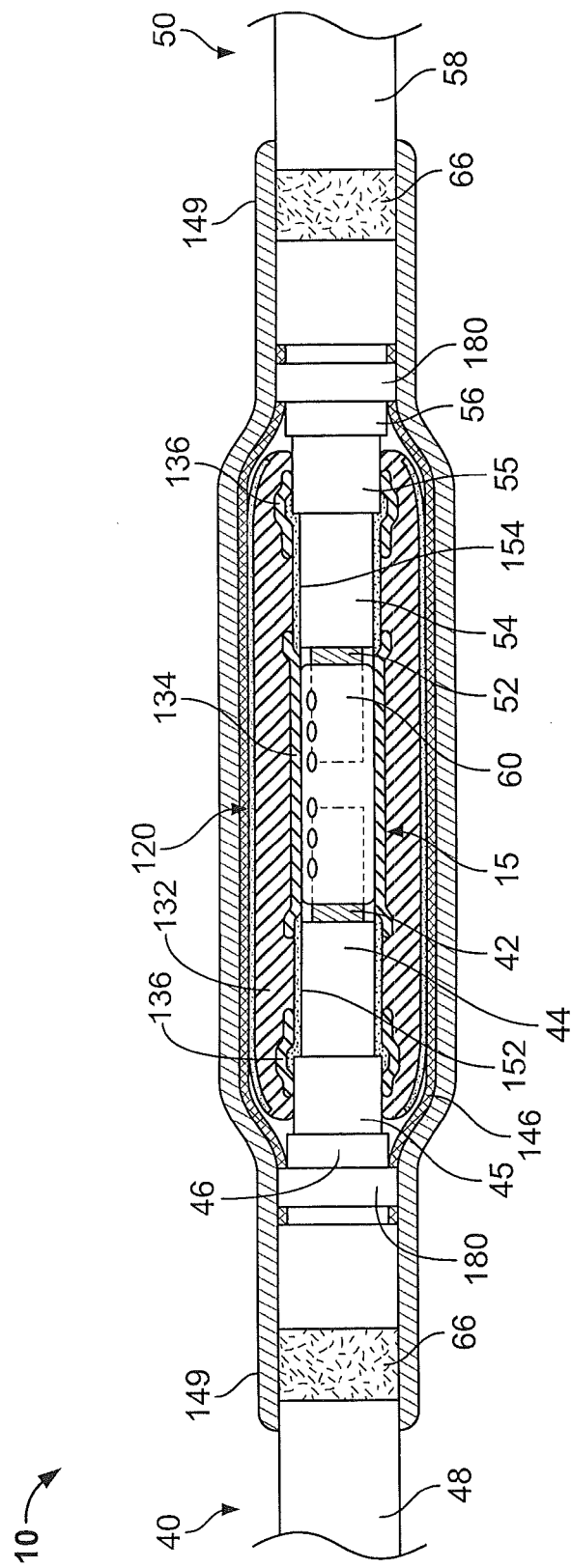
FIG. 5 is a cross-sectional view of a connection assembly including a cover assembly of the pre-expanded cover assembly unit of FIG. 1 mounted on a splice connection.

The cover assembly 100 may be used to cover and electrically insulate electrical substrates such as cables and connectors. The cover assembly 100 may be used to cover and seal a connection or splice between two or more cables 40, 50 including an electrical connector 60 to form a connection assembly 10 as shown in FIG. 5. According to some embodiments, the cables 40, 50 are concentric neutral cables. According to some embodiments, the cables 40, 50 are metal tape shielded or longitudinally corrugated (LC) metal shielded cables.

Figure 6:
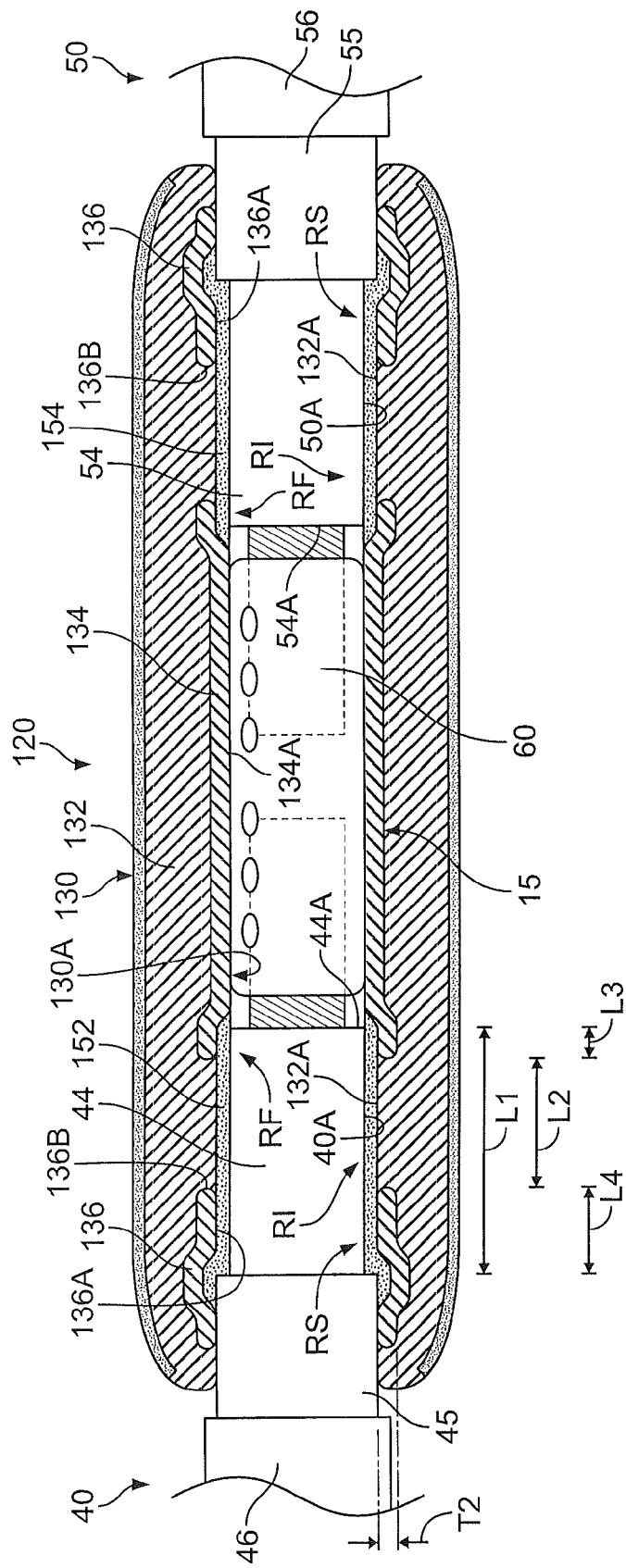
FIG. 6 is a fragmentary, cross-sectional view of the connection assembly of FIG. 5 showing a splice body assembly of the cover assembly mounted on the splice connection.

The cover assembly 100 may be deployed and mounted on the intended substrate in a retracted state or position as shown in FIGS. 5 and 6 and discussed in more detail below. According to some embodiments, the cover assembly 100 is a cold shrink cover, meaning that it can be shrunk or retracted about the substrate without requiring the use of applied heat.

The cover assembly 100 includes a splice body assembly 120, an outer sleeve (or re-jacket) 140, and a metal shield mesh layer 146. The splice body assembly 120 includes a splice body 130 and a pair of tubular patches, strips or layers of a flowable, electrically insulative, conformable material or medium ("the conformable medium") 152, 154. According to some embodiments and as discussed herein, the conformable medium of the layers 152, 154 is a conformable, flowable, electrically insulative mastic.

The splice body 130 includes a tubular primary insulation sleeve or layer 132, a tubular Faraday cage layer 134, a pair of tubular stress cone layers 136, and a semiconductor layer 138.

Referring to FIGS. 1 and 2, the cover assembly 100 has a lengthwise axis A-A. The splice body assembly 120, the outer sleeve 140, and the metal shield mesh layer 146 are provided as an integral, unitary structure extending lengthwise along the axis A-A. According to some embodiments, the cover assembly 100 is provided pre-installed and pre-expanded on the holdout 102.

The splice body 130 has opposed inner and outer surfaces 130A and 130B, and opposed ends 130C, 130D. The splice body 130 is tubular and the inner surface 130A defines an axially extending conductor through passage 130E that communicates with opposed end openings 130F, 130G.

The primary insulation layer 132 is tubular and generally forms the bulk of the splice body 130 except for the Faraday cage layer 134, the stress cone layers 136, and the semiconductor layer 138. The primary insulation layer 132 has axially spaced apart primary insulation interface surfaces 132A defining portions of the splice body inner surface 130A, and thereby portions of the passage 130E.

The primary insulation layer 132 can be formed of any suitable material. According to some embodiments, the primary insulation layer 132 is formed of a dielectric or electrically insulative material. According to some embodiments, the primary insulation layer 132 is formed of an elastically expandable material. According to some embodiments, the primary insulation layer 132 is formed of an elastomeric material. According to some embodiments, the primary insulation layer 132 is formed of liquid silicone rubber (LSR). Other suitable materials may include EPDM or ethylene propylene rubber (EPR). According to some embodiments, the primary insulation layer 132 has a Modulus at 100 percent elongation (M100) in the range of from about 0.4 to 0.52 MPa.

According to some embodiments, the thickness of the primary insulation layer 132 is in the range from about 0.07 to 2 inches. According to some embodiments, the length of the primary insulation layer 132 is in the range from about 8 to 30 inches.

The Faraday cage layer 134 is a generally tubular sleeve bonded to the inner surface of the primary insulation layer 132. The Faraday cage layer 134 may be formed of a suitable elastically conductive elastomer. In use, the Faraday cage layer 134 may form a Faraday cage to provide an equal potential volume about the connector 60 so that an electric field is cancelled in the surrounding air voids. The Faraday cage layer 134 has a Faraday cage interface surface 134A defining a portion of the splice body inner surface 130A, and thereby a portion of the passage 130E.

The stress cone layers 136 are axially spaced apart, generally tubular sleeves bonded to the inner surface of the primary insulation layer 132 at either end 130C, 130D of the splice body 130. The stress cone layers 136 may be formed of a suitable electrically conductive elastomer. In use, the stress cone layers 136 may serve to redistribute the voltage along the surface of the cable insulation 44, 54 to reduce or prevent the degradation of the insulation 44, 54 that might otherwise occur. Each stress cone layer 136 has a stress cone interface surface 136A defining a portion of the splice body inner surface 130A, and thereby a portion of the passage 130E.

According to some embodiments, the Faraday cage layer 134 and the stress cone layers 136 are formed of a material having a Modulus at 100 percent elongation (M100) in the range of from about 0.68 to 0.88 MPa.

The semiconductor layer 138 fully circumferentially surrounds the primary insulation layer 132. According to some embodiments, the semiconductor layer 138 is coextensive with the primary insulation layer 132.

The semiconductor layer 138 can be formed of any suitable electrically semiconductive material. According to some embodiments, the semiconductor layer 138 is formed of an elastically expandable material. According to some embodiments, the semiconductor layer 138 is formed of an elastomeric material. According to some embodiments, the semiconductor layer 138 is formed of carbon black and silicone. Other suitable materials may include carbon black and EPDM.

The mastic layers 152, 154 (FIGS. 2 and 3) are generally tubular and axially spaced apart. Each mastic layer 152, 154 is adhered or bonded by its outer surface to the inner surface 130A of the splice body 130.

According to some embodiments, each mastic layer 152, 154 has a thickness T1 (FIG. 2) in the range of from about 0.5 mm to 5 mm.

According to some embodiments and as illustrated, each mastic layer 152, 154 spans at least a region RI extending from the edge of the faraday cage 134 to the adjacent edge of the proximate stress cone 136. That is, the mastic layer 152, 154 fully covers and is bonded to a respective one of the primary insulation interface surfaces 132A.

According to some embodiments and as illustrated, each mastic layer 152, 154 also spans a region RF over a portion of the Faraday cage interface surface 134A. That is, the mastic layer 152, 154 fully covers and is bonded to the Faraday cage interface surface 134A across this region RF.

According to some embodiments and as illustrated, each mastic layer 152, 154 also spans a region RS over a portion of the a respective one of the stress cone interface surfaces 136A. That is, the mastic layer 152, 154 fully covers and is bonded to the respective stress cone interface surface 134A across this region RS.

The mastic 152, 154 may be any suitable type of mastic having the necessary or desired properties to function as intended. In particular, the mastic 152, 154 should be sufficiently soft that it can conform to surfaces of the cables 40, 50 as discussed below, and should have adequate dielectric strength to control electrical stress.

According to some embodiments, the mastic 152, 154 is a silicone rubber-based mastic.

According to some embodiments, the mastic 152, 154 has a hardness in the range of up to about Shore A 10.

According to some embodiments, the mastic 152, 154 has an elongation in the range of from about 100% to 400%.

According to some embodiments, the mastic 152, 154 has a density in the range of from about 0.9 to 1.3 g/cm$^3$.

According to some embodiments, the mastic 152, 154 has a dielectric constant in the range of from about 3 to 12.

According to some embodiments, the mastic 152, 154 has a volume resistivity in the range of from about $10^9$ to $10^{14}$ Ohm-cm.

According to some embodiments, the mastic 152, 154 has a dielectric strength in the range of from about 450 to 800 Volts/mil.

The shield mesh layer 146 fully circumferentially surrounds the splice body 130. According to some embodiments, the shield mesh layer 146 includes opposed end sections that extend beyond the ends of the splice body 130 but do not extend as far out as the outer sleeve 140. The shield mesh layer 146 may be formed of braided or woven copper filaments, for example.

The outer sleeve 140 has opposed inner and outer surfaces 140A and 140B, and opposed ends 142A, 142B. The outer sleeve 140 is tubular and defines an axially extending conductor through passage 143 that communicates with opposed end openings at the ends 142A, 142B. When mounted on the holdout 102 as shown in FIGS. 1 and 2, outer sections 149 of the outer sleeve 140 are folded back on an intermediate section 148 of the outer sleeve 140 at annular folds 149A.

The outer sleeve 140 can be formed of any suitable material. According to some embodiments, the outer sleeve 140 is formed of an electrically insulative material. According to some embodiments, the outer sleeve 140 is formed of an elastically expandable material. According to some embodiments, the outer sleeve 140 is formed of an elastomeric material. According to some embodiments, the outer sleeve 140 is formed of ethylene propylene diene monomer (EPDM) rubber. Other suitable materials may include neoprene or other rubber. According to some embodiments, the outer sleeve 140 has a Modulus at 100 percent elongation (M100) in the range of from about 0.6 to 1.1 MPa.

According to some embodiments, the thickness of the outer sleeve 140 is in the range of from about 0.11 to 0.25 inch. According to some embodiments, the length of the outer sleeve 140 is in the range of from about 15 to 35 inches.

The holdout 102 can be formed of any suitable material. The holdout 102 has an outer surface 106 and defines a through passage 108. According to some embodiments, the holdout 102 includes a flexible strip 104 helically wound to form a rigid cylinder and having a pull tab or end segment 102A extending through the passage 108 as illustrated, for example. According to some embodiments, the holdout 102 is formed of a semi-rigid polymeric material. According to some embodiments, the holdout 102 is formed of polypropylene, ABS, or PVC. The holdout device 102 may be factory installed.

The splice body assembly 120, the cover assembly 100, and the pre-expanded unit 101 may be formed by any suitable method and apparatus. According to some embodiments, the mastic layers 152, 154 are pre-mounted on the outer surface 106 of the holdout 102, and the splice body 130 is thereafter installed over the holdout 102 and the mastic layers 152, 154. The splice body 130 may be formed by any suitable method, such as molding and/or extruding.

The cover assembly 100 may be formed by any suitable method and apparatus. According to some embodiments, the splice body 130 is molded and the outer sleeve 140 is thereafter insert overmolded about the splice body 130, before or after mounting the splice body 130 over the holdout 102 and the mastic layers 152, 154.

According to some embodiments, the splice body 130 is unitarily molded. According to some embodiments, the outer sleeve 140 is unitarily molded.

According to some embodiments, when mounted on the holdout 102, the splice body 130 is maintained in an elastically radially expanded state or position. According to some embodiment, in the expanded state the splice body 130 is expanded in the range of from about 400 to 200 percent of its relaxed diameter. As a result, the splice body 130 of the pre-expanded unit 101 will exert a radially compressive pressure or load on the mastic layers 152, 154 (which are constrained on their interior sides by the rigid holdout 102). According to some embodiments, this compressive load is in the range of from about 5 psi to 25 psi. According to some embodiments, in spite of this compressive loading, the mastic 152, 154 will retain its general shape and position and will resist bleed out of oil, which might otherwise migrate within the interstices of the holdout 102.

Referring now to FIG. 5, the cover assembly 100 may be applied over a splice connection 15 between a pair of electrical power transmission cables 40, 50 to form a connection assembly 10. According to some embodiments, the cables 40, 50 are medium-voltage (e.g., between about 5 and 35 kV) or high-voltage (e.g., between about 46 and 230 kV) power transmission cables.

Figure 4:
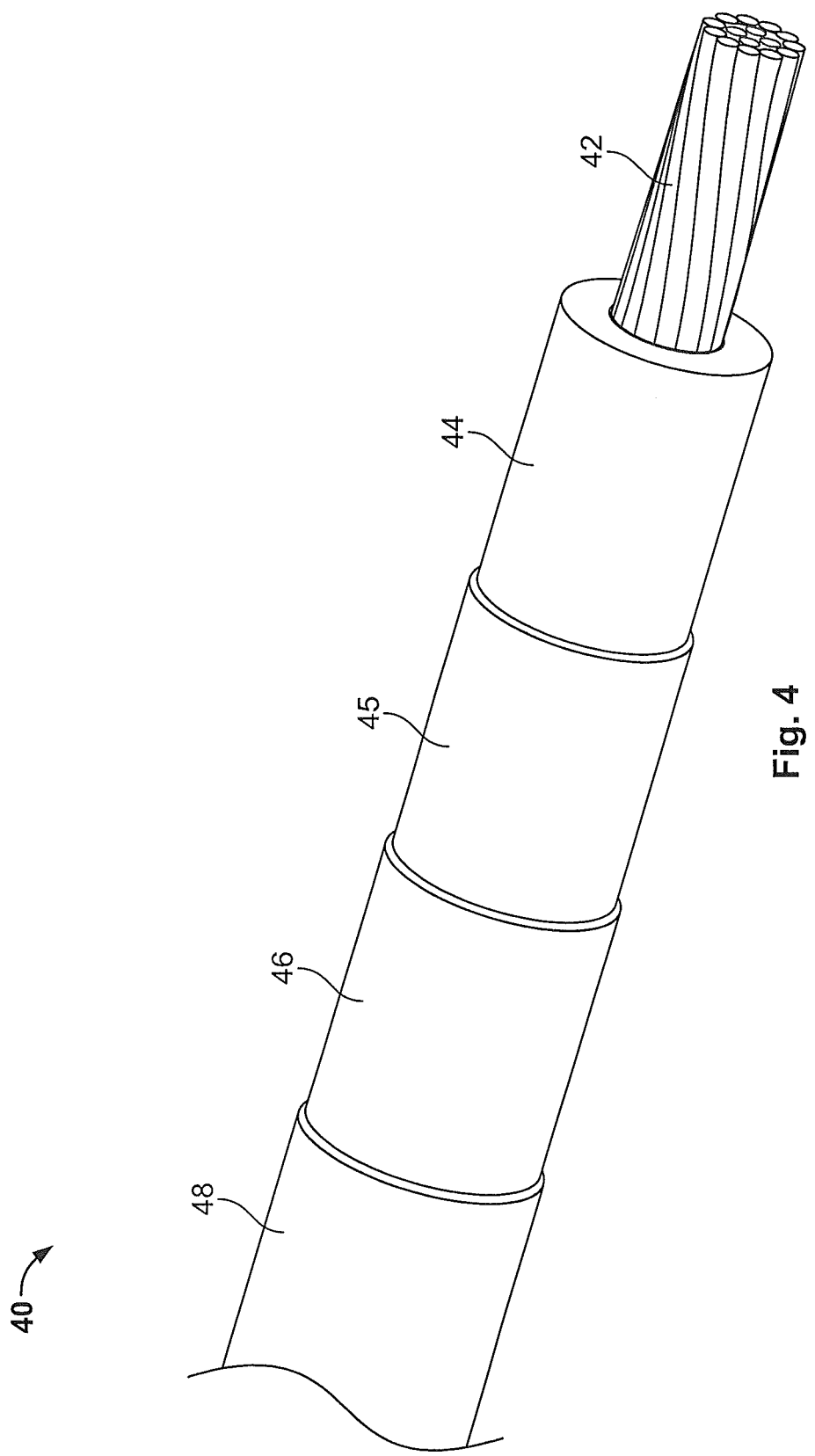
FIG. 4 is a fragmentary, perspective view of an exemplary polymeric insulated power transmission cable for use with the pre-expanded cover assembly unit of FIG. 1.

As shown in FIG. 4, the cable 40 includes a primary electrical conductor 42, a polymeric insulation layer 44, a semiconductor layer 45, a metal electromagnetic radiation shield layer 46, and a jacket 48, with each component being concentrically surrounded by the next.

According to some embodiments and as shown, the shield layer 46 is a metal tape, foil, strip or sheath fully circumferentially surrounding the semiconductor layer 45 along the length of the cable. The metal strip may be longitudinally or helically wrapped about the semiconductor layer 45, for example. According to some embodiments, the cable 40 is an LC shielded cable and the shield layer 46 is a thin corrugated metal layer. In other embodiments, the shield layer 46 may include individual wires, which may be helically wound about the semiconductor layer 45.

The primary conductor 42 may be formed of any suitable electrically conductive materials such as copper (solid or stranded). The polymeric insulation layer 44 may be formed of any suitable electrically insulative material such as crosslinked polyethylene (XLPE) or EPR. The semiconductor layer 45 may be formed of any suitable semiconductor material such as carbon black with silicone. The shield layer 46 may be formed of any suitable material such as copper. The jacket 48 may be formed of any suitable material such as EPDM or PVC.

The cable 50 (FIG. 5) is similarly constructed with a primary electrical conductor 52, a polymeric insulation layer 54, a semiconductor layer 55, a metal shield layer 56, and a jacket 58 corresponding to components 42, 44, 45, 46 and 48, respectively.

The connection assembly 10 may be formed and the cover assembly 100 may be installed as follows. The cables 40, 50 are prepared as shown in FIG. 4 such that a segment of each layer extends beyond the next overlying layer.

The pre-expanded unit 101 is slid over one of the cables 40, 50. According to some embodiments, the inside diameter of the holdout 102 is greater than the outer diameter of each cable 40, 50 and the connector 60 such that the inner diameter of the holdout 102 is sufficient to receive the prepared cable 40, 50 and the connector 60 without undue effort. According to some embodiments, the inner diameter of the holdout 102 is at least as great as the outer diameter of the largest portion of the cables or connector that are to be received in the passage 136. The pre-expanded unit 101 may be retained or parked on a cable 40, 50 until the operator is ready to install the cover assembly 100 on the cables 40, 50.

The electrical connector 60 is secured to each primary conductor 42, 52 to mechanically and electrically couple the primary conductors 42, 52 to one another as shown in FIG. 5. The connector 60 may be any suitable type of connector such as a metal crimp connector.

The pre-expanded unit 101 is then slid into position over the connector 60. The holdout 102 is then removed from the cover assembly 100, thereby permitting the elastomeric sleeves 130, 140 to relax and radially retract about the cables 40, 50 and the connector 60 as shown in FIG. 5, as discussed in more detail below. According to some embodiments, the splice body 130 overlaps and engages the semiconductor layers 45, 55 of the cables 40, 50.

The mastic layers 152, 154 preferentially adhere to the inner surface 130A of the splice body 130 and separate or release from the holdout strip 104. The mastic layers 152, 154 are thus sandwiched between the splice body 130 and the cables 40, 50 and directly engage the interface surfaces 40A, 50A of the cables 40, 50 as shown in FIGS. 5 and 6. The splice body 130 is not fully recovered to its relaxed state, and therefore continues to apply a persistent radially compressive load or pressure to the mastic layers 152, 154.

The shield mesh 146 is rolled outwardly onto the semiconductor layers 45, 55 as shown in FIG. 5. A retainer 180 (e.g., a metal mesh web or clamp) can be wrapped about each cable 40, 50 as also shown in FIG. 5 to secure the end edges of the shield mesh 146. The retainers 180 may be wrapped about exposed ends of the shield layers 46, 56 to electrically connect the shield mesh 146 to the shield layers 46, 56.

Strips of flowable sealant 66 (FIG. 5) are applied to the outer surfaces of the cable jackets 48, 58. According to some embodiments, the sealant 66 is a mastic. The operator then rolls each of the extension sections 149 of the outer sleeve 140 axially outwardly to cover the adjacent sections of the cables 40 and 50, respectively. According to some embodiments, at least a portion of each extension section 149 overlaps a respective portion of each cable jacket 48, 58 and engages the associated sealant strip 66 to provide a moisture seal. According to some embodiments, the axial length of overlap between each extension section 149 and the underlying jacket 48, 58 is at least 1 inch.

The relaxed inner diameter of the outer sleeve 140 is less than at least the outer diameter of the jacket layers 48, 58. Therefore, the outer sleeve 140 exerts a radially inwardly compressive or clamping force or pressure (due to elastic tension) onto the cables 40, 50. The outer sleeve 140 may thereby effect a liquid tight seal at the interfaces between the extension sections 149 and the cable jackets 48, 58 and at the interfaces between the cable jackets 48, 58 and the outer sleeve 140. These seals can protect the cable and the splice from the ingress of environmental moisture.

The relaxed inner diameter of the splice body 130 is less than at least the outer diameter of the cable insulation layers 44, 54. Therefore, the splice body 130 exerts a radially inwardly compressive or clamping force or pressure (due to elastic tension) onto the cables 40, 50 and the mastic layers 152, 154. According to some embodiments, the relaxed inner diameter of the primary insulation layer 132 is at least 10% less than the smallest diameter cable upon which the cover assembly 100 is intended to be installed.

The cover assembly 100 is thereby fully installed to form the connection assembly 10 as shown in FIG. 5. As shown in FIGS. 5 and 6, each mastic layer 152, 154 is interposed between and engages each of the inner surface 130A of the splice body 130 and opposing interface surfaces 40A, 50A of the cable insulation layers 44, 54 and the cable semiconductor layers 45, 55. The splice body assembly 120 is configured and positioned relative to the splice connection 15 such that each mastic layer 152, 154 surrounds and engages the cable insulation 44, 54 across the entirety of the regions RI. According to some embodiments, each mastic layer 152, 154 surrounds and engages the cable insulation 44, 54 at least from a terminal edge 44A, 54A of the insulation layer 44, 54 to the proximal edge 136B of the proximal stress cone 136. According to some embodiments, each mastic layer 152, 154 extends at least from the terminal edge 44A, 54A of the insulation layer 44, 54 to the corresponding cable semiconductor layer 45, 55 and, in some embodiments, overlaps a section of the cable semiconductor layer 45, 55 as shown, for example. Thus, it can be seen that in some embodiments (e.g., as shown in FIG. 6), the splice body assembly 120 and the splice connection 15 are relatively arranged and configured such that the Faraday cage layer 134, the stress cone layers 136, and the mastic layers 152, 154 collectively form an axially and circumferentially continuous tube surrounding the cables 40, 50 and the connector 60 from the cable semiconductor layer 45 to the cable semiconductor layer 55 (and also overlapping the semiconductor layers 45, 55).

According to some embodiments, each mastic layer 152, 154 has a length L1 (when installed; FIG. 6) in the range of from about 55 mm to 90 mm.

According to some embodiments, the length L2 (when installed; FIG. 6) of the region RI is in the range of from about 50 mm to 70 mm.

According to some embodiments, the length L3 (when installed; FIG. 6) of the region RF is in the range of from about 5 mm to 10 mm.

According to some embodiments, the length L4 (when installed; FIG. 6) of each region RS is in the range of from about 5 mm to 10 mm.

According to some embodiments, the mastic layers 152, 154, when installed, have a thickness T2 (FIG. 6) in the range of from about 0.5 mm to 5 mm.

The pre-expanded unit 101, and particularly the splice body assembly 120, and the mastic layers 152, 154, can provide significant advantages during installation and in service. The electrical interface between a splice body and spliced cables is typically the weakest link in the insulation system of a medium or high voltage joint. In particular, joint failures tend to be initiated by insulation failures along this electrical interface, which is the interface between the cable insulation and the joint or splice body extending from the Faraday cage to the stress cone (e.g., the region RI as shown in FIG. 6), which may be referred to as the creepage distance.

Electrical interfaces between cables and splice bodies may be electrically weak compared to the bulk dielectric strength of the primary splice body insulation for a number of reasons. The interface between the cable and the splice body is imperfect and contains small amounts of air (e.g., in microvoids) that electrically ionize in the electrical field and can cascade into complete dielectric breakdown. The cable insulation is exposed during installation and can become contaminated with water or other conductive contaminants.

To address the foregoing concerns, it is known in the prior art to hand apply silicone grease along the interface prior to installation of the splice body to fill voids and increase dielectric strength. However, problems occur when the grease is contaminated during installation or partially applied or not applied at all, which can lead to dielectric breakdown.

Apparatus and methods according to embodiments of the present invention can address the foregoing concerns by providing high dielectric strength, conformable mastic layers 152, 154 integrally applied with the cold-shrink splice body 130 to the interface surfaces 40A, 50A of the cables 40, 50 (while also engaging the splice body interface surfaces 132A, 134A, 136A), which increases the dielectric strength of the electrical interfaces and may at the same time remedy the installation deficiencies as described above for silicone grease.

The mastic layers 152, 154, (particularly when comprised of silicone rubber-based mastic as described hereinabove) serve as a flowable, conformable medium between the splice body 130 and the cables 40, 50 to provide the following advantages, which may lead to increased electrical reliability. The mastic layers 152, 154 applied and retained under the elastic pressure of the partially radially expanded splice body 130 will flow and conform to the irregularities of the exposed surfaces of the cables 40, 50 and the inner surface 130A of the splice body 130, thereby eliminating air voids (in surface microvoids or macrovoids) and electrically ionizable sites. The mastic layers 152, 154 can engulf and isolate contaminants to thereby increase the overall dielectric strength of the interface. The mastic layers 152, 154 can be factory-applied to the splice body 130 (to form the splice body assembly 120) and factory-mounted on the holdout 102 (to form the pre-expanded unit 101 or a part thereof), and can be integrally applied to the splice connection 15 in a single step with the splice body 130. As such, the risks that an installer may forget to apply the mastic or that the mastic may be contaminated are eliminated.

According to some embodiments (e.g., when formed from a silicone-based mastic as described hereinabove), the mastic 152, 154 is formulated to be stable under the elastic compression force of the splice body 130 while expanded on the holdout 102. According to some embodiments, the mastic 154 is resistant to oil bleed out under pressure and does not migrate in between the interstices of the spiral holdout 102.

According to some embodiments, an electrical connector of a different type may be used in place of the shear bolt connector 60.

While an "all-in-one" cover assembly 100 has been shown and described, the splice body assembly 120 may be provided independently. For example, the splice body assembly 120 may be pre-mounted on the holdout 102 to form a pre-expanded splice body assembly without the shield mesh 146 and jacket 140 being mounted thereover. A shield layer and jacket may be separately installed on the splice connection 15 after the splice body assembly 120 has been installed.

According to further embodiments, the conformable medium layers 152, 154 may be replaced with a silicone gel of the same configuration, dimensions, and electrical properties as described above. According to some embodiments, the silicone gel has a hardness greater than or equal to about 40 grams hardness as measured on a Voland texture analyzer.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. A method for protecting a cable splice connection including a cable, the cable including an electrical conductor surrounded by a cable insulation layer, the method comprising:

providing a splice body assembly including:

an electrically insulative, elastomeric splice body having an interior surface defining an interior passage, the splice body including:

a Faraday cage layer including a Faraday cage interface surface forming a part of the interior surface of the splice body defining the interior passage;

a stress cone layer including a stress cone interface surface forming a part of the interior surface of the splice body defining the interior passage; and a primary insulation layer including a primary insulation interface surface forming a part of the interior surface defining the interior passage, the primary insulation interface layer extending axially from the Faraday cage interface surface to the stress cone interface surface; and a layer of a conformable medium pre-mounted on the interior surface of the splice body, wherein the conformable medium is pre-mounted on the primary insulation interface surface, wherein the conformable medium is a flowable, electrically insulative material; and mounting the splice body assembly on the cable splice connection such that the layer of the conformable medium is interposed between and is in direct contact with each of the interior surface of the splice body and an opposing interface surface of the cable insulation layer;

wherein mounting the splice body assembly on the cable splice connection includes mounting the splice body assembly on the splice connection such that the layer of the conformable medium is interposed between and is in direct contact with each of the primary insulation interface surface and the opposing interface surface of the cable insulation at least from the Faraday cage interface surface to the stress cone interface surface.

2. The method of claim 1 including:

providing a pre-expanded splice body assembly including a holdout and the splice body assembly mounted thereon such that the holdout maintains the splice body in an elastically radially expanded state;

wherein mounting the splice body assembly on the splice connection includes positioning the pre-expanded splice body assembly adjacent the cable splice connection and removing the holdout from the splice body assembly to permit the splice body to elastically radially contract onto the cable splice connection.

3. The method of claim 2 wherein the holdout includes a tubular holdout formed by a helically wound strip, and removing the holdout from the splice body assembly includes pulling the strip.

4. The method of claim 1 wherein:

the cable includes a semiconductor layer surrounding the cable insulation layer; and mounting the splice body assembly on the cable splice connection includes mounting the splice body assembly on the cable splice connection such that the layer of the conformable medium is also interposed between and engages each of the interior surface of the splice body and an opposing interface surface of the semiconductor layer.

5. The method of claim 1 wherein:

the conformable medium is pre-mounted on the Faraday cage interface surface;

the conformable medium is pre-mounted on the stress cone interface surface; and the method includes mounting the splice body assembly on the cable splice such that:

the layer of the conformable medium is interposed between and engages each of the Faraday cage interface surface and the opposing cable insulation surface; and the layer of the conformable medium is interposed between and engages each of the stress cone interface surface and the opposing cable insulation surface.

6. The method of claim 1 wherein the layer of the conformable medium extends a distance in the range of from about 50 mm to 70 mm from the Faraday cage interface surface to the stress cone interface surface.

7. The method of claim 1 wherein the layer of the conformable medium has a thickness in the range of from about 0.5 mm to 5 mm following the step of mounting the splice body assembly on the cable splice connection.

8. The method of claim 1 wherein the conformable medium is a mastic.

9. The method of claim 8 wherein the mastic is a silicone rubber-based mastic.

10. The method of claim 8 wherein:

the mastic has an elongation in the range of from about 100% to 400%; and the mastic has a hardness in the range of up to about Shore A 10.

11. The method of claim 8 wherein the mastic has a dielectric strength in the range of from about 450 Volts/mil to 800 Volts/mil.

12. The method of claim 1 wherein the splice body is formed of silicone rubber.

13. The method of claim 1 wherein, after the splice body assembly is mounted on the cable splice connection, the splice body applies a persistent radially compressive load to the layer of the conformable medium.

14. A method for protecting a cable splice connection including a cable, the cable including an electrical conductor surrounded by a cable insulation layer and a semiconductor layer surrounding the cable insulation layer, the method comprising:

providing a splice body assembly including:

an electrically insulative, elastomeric splice body having an interior surface defining an interior passage; and a layer of a conformable medium pre-mounted on the interior surface of the splice body, wherein the conformable medium is a flowable, electrically insulative material; and mounting the splice body assembly on the cable splice connection such that the layer of the conformable medium is interposed between and is in direct contact with each of the interior surface of the splice body and an opposing interface surface of the cable insulation layer;

wherein mounting the splice body assembly on the cable splice connection includes mounting the splice body assembly on the cable splice connection such that the layer of the conformable medium is also interposed between and is in direct contact with each of the interior surface of the splice body and an opposing interface surface of the semiconductor layer.

15. The method of claim 14 wherein the conformable medium is a mastic.

16. The method of claim 15 wherein the mastic is a silicone rubber-based mastic.

* * * * *